(12) United States Patent  
Marozsak

(10) Patent No.: US 8,736,348 B2  
(45) Date of Patent: May 27, 2014

(54) CURRENT EFFICIENT MIXER ARCHITECTURE

(75) Inventor: Tamas Marozsak, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 210 days.

(21) Appl. No.: 13/241,478

(22) Filed: Sep. 23, 2011

(65) Prior Publication Data

US 2013/0076438 A1    Mar. 28, 2013

(51) Int. Cl.
*G06F 7/44* (2006.01)
*G06G 7/16* (2006.01)

(52) U.S. Cl.
USPC .......................................... 327/359; 327/354

(58) Field of Classification Search
USPC .......... 327/354–361, 530, 538–541; 330/254; 455/326, 333
See application file for complete search history.

(56) References Cited

U.S. PATENT DOCUMENTS

| | | | |
|---|---|---|---|
| 6,184,747 B1 * | 2/2001 | Helgeson et al. | 327/552 |
| 7,847,613 B1 * | 12/2010 | Samavati | 327/359 |
| 8,493,136 B2 * | 7/2013 | Bellaouar et al. | 327/540 |

OTHER PUBLICATIONS

U.S. Appl. No. 13/097,698, filed Apr. 29, 2011, entitled, "Performing Testing in a Radio Device," by Hendricus De Ruijter.

Silicon Labs, Wireless Solutions, "EZRadio and EZRadioPRO, Complete family of transmitters, transceivers and receivers," 2010, 2 pages.

* cited by examiner

*Primary Examiner* — Lincoln Donovan
*Assistant Examiner* — Diana J Cheng
(74) *Attorney, Agent, or Firm* — Trop, Pruner & Hu, P.C.

(57) ABSTRACT

In one embodiment, the present invention includes a mixer having various stages, including a transconductance stage with a differential transistor pair, a bias circuit, and a feedback circuit. The transistor pair can include a first transistor having a first terminal to receive a first input radio frequency (RF) voltage and to output a first RF current via a second terminal of the first transistor, and a second transistor having a first terminal to receive a second input RF voltage and to output a second RF current via a second terminal of the second transistor. In turn, the bias circuit is coupled to the second terminals of the transistors to provide a bias current to these transistors. The feedback circuit is in turn coupled to the second terminals of the transistors to generate a feedback signal corresponding to a common mode voltage at the second terminals of the transistors.

19 Claims, 3 Drawing Sheets

CURRENT EFFICIENT MIXER ARCHITECTURE

BACKGROUND

A variety of radio devices are available, from those formed of discrete analog components as in conventional radios such as traditional broadcast radios, 2-way radios such as walkie-talkies, to more advanced radios. As technology advances, radio devices are formed with fewer components and can even be integrated into single chip devices. Such radios can be used for broadcast reception. In addition, radios can be implemented using transceivers that provide for both transmit and receive functionality. Such transceivers are often incorporated within a wireless telephone to provide for wireless voice and data communications.

In general, wireless signals are communicated as radio frequency (RF) signals and when received in a radio, are processed and downconverted to a lower frequency at which various demodulation, decoding and so forth is performed. In a transmit direction, oftentimes digital signals are processed to provide a given modulation. These signals are then converted to an RF signal for transmission from the radio.

To effect frequency conversion, both in upconversion and downconversion directions, one or more mixers can be used. In general, a mixer receives a signal at a first frequency and converts it to a signal of a different frequency, either higher or lower than the received signal. This control of the mixer generally occurs based on a mixing signal, which can be received from a local oscillator.

SUMMARY OF THE INVENTION

According to one aspect, the present invention is directed to a mixer that can be used in many different types of systems to effect frequency conversions. This mixer can include various stages, including a transconductance stage that has a differential transistor pair, a bias circuit, and a feedback circuit. The transistor pair can include a first transistor having a first terminal to receive a first input radio frequency (RF) voltage and to output a first RF current via a second terminal of the first transistor, and a second transistor having a first terminal to receive a second input RF voltage and to output a second RF current via a second terminal of the second transistor. In turn, the bias circuit is coupled to the second terminals of the transistors to provide a bias current to these transistors. The feedback circuit is in turn coupled to the second terminals of the transistors to generate a feedback signal corresponding to a common mode voltage at the second terminals of the transistors.

In many implementations, this stage can be controlled to be configured for different modes of operation by way of a controller. For example, a controller can selectively control the differential transistor pair to be of a first size for a first operation mode or a second size for a second operation mode. And, this controller can enable an amplifier having a first input coupled to receive the feedback signal and a second input coupled to receive a reference voltage and an output to gate the bias circuit in the second operation mode.

Another aspect of the present invention is directed to a method, including accessing configuration information via a controller, the configuration information to indicate a mode of operation for a transconductance stage of a mixer, configuring a differential pair of the stage to be a first size for a first operation mode or a second size for a second operation mode according to the configuration information, controlling a bias circuit to provide a first bias current to the differential pair for the first operation mode or a second bias current to the differential pair for the second operation mode, and controlling a feedback circuit to provide a feedback signal to the differential pair in the first operation mode and to provide the feedback signal to a first input of an amplifier in the second operation mode.

A still further aspect of the present invention is directed to a system that can include a radio. This radio can have a low noise amplifier (LNA) to receive and amplify a RF signal and a mixer coupled to the LNA to receive and downconvert the amplified RF signal to a second frequency signal. In turn, this mixer can include a transconductance stage, a mixer core and a transimpedance amplifier. The transconductance stage can have a differential transistor pair to receive the amplified RF signal and to output an RF current, a bias circuit coupled to the differential transistor pair to provide a bias current to the differential transistor pair, and a feedback circuit coupled to the differential transistor pair to generate a feedback signal from the transconductance stage output. In turn, the mixer core can receive and downconvert the RF current to a second frequency current using a local oscillator signal. Then the transimpedance amplifier can receive the second frequency current and generate the second frequency signal to be provided to further circuitry of the radio.

DETAILED DESCRIPTION

Figure 1:
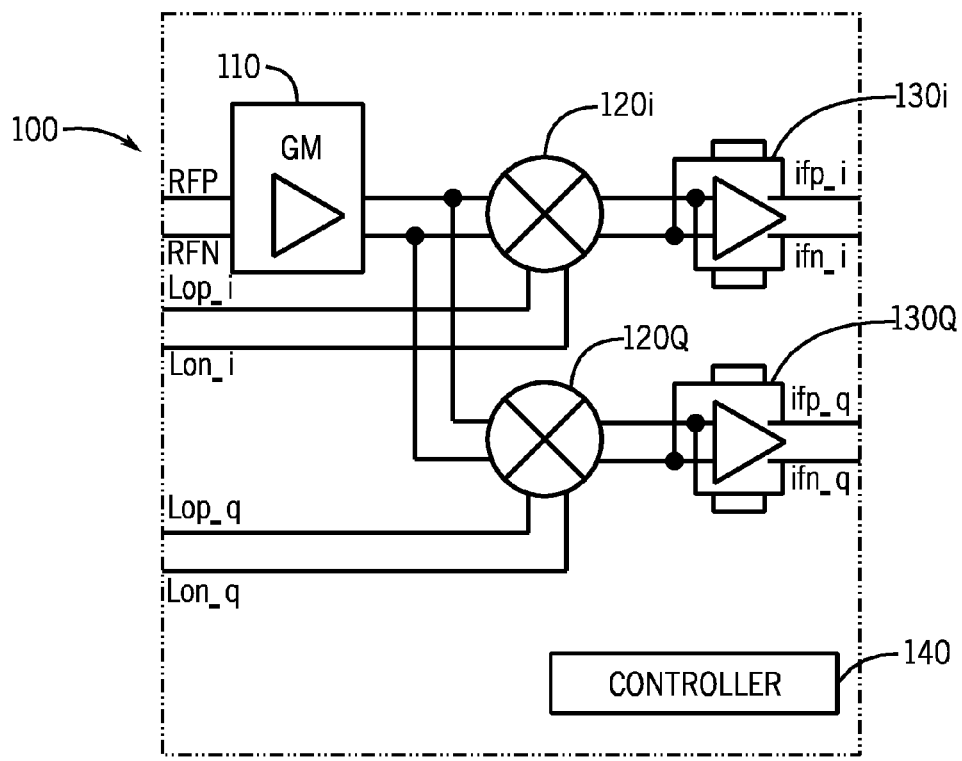
FIG. 1 is a block diagram of a mixer in accordance with an embodiment of the present invention.

Referring now to FIG. 1, shown is a block diagram of a mixer in accordance with an embodiment of the present invention. As shown in FIG. 1, mixer 100 is coupled to receive an incoming radio frequency (RF) signal and downconvert it to a lower frequency signal. In various implementations, mixer 100 may be configured to downconvert an incoming RF signal to an intermediate frequency (IF) frequency, according to a mixing signal, which may be fed to the mixer from a local oscillator (LO) (not shown for ease of illustration in FIG. 1).

As seen in the embodiment of FIG. 1, the incoming RF signal, which may be a differential signal (having positive and negative portions, namely RFP and RFN) received from an input stage of a receiver such as a low noise amplifier (LNA), may be provided to a transconductance (gm) stage 110. Transconductance stage 110 may convert the incoming RF voltage signals to RF currents. In the embodiment of FIG. 1, transconductance stage 110 converts the differential input voltage to a differential current. In turn, this transconductance stage is coupled to corresponding quadrature mixer cores 120i and 120q (that collectively form a complex mixer core 120), each of which is configured to receive the incoming RF differential current signal and corresponding local oscillator signals, namely LOp and LOn (with separate LO mixer signals provided for each of the I and Q mixer cores).

Complex mixer core 120 thus downconverts the incoming RF currents to lower frequency currents (e.g., at an IF frequency). By way of the front end gm stage 110 that outputs currents rather than voltages, complex mixer core 120 can be realized by passive switches that have no DC currents flowing therethrough, and thus have no significant noise contribution. In turn, these lower frequency currents are provided to corresponding amplifiers 130i and 130q, which may be transimpedance amplifiers (TIAs) to ensure high gain for the mixer. Both the passive switches of mixer core 120 and the IF transimpedance amplifier 130 can be designed for low noise and high linearity operation such that transconductor stage 110 alone may determine the mixer performance. Note that the signal swing on the transconductance stage output can be small (e.g., on the order of approximately 100 millivolts (mV)), which enables good linearity of the transconductance stage cell. A transconductance stage in accordance with an embodiment of the present invention may have multiple high third order intercept (IP3) operating modes, and can use passive switches to ensure good overall IP3 and noise performance.

As further seen in FIG. 1, mixer 100 can include a controller 140. In one embodiment, controller 140 may be a microcontroller unit (MCU) that is directly associated with the mixer. Or more generally, the controller can be of a radio or other device in which the mixer is included. In various embodiments, controller 140 may configure various components of the mixer for a particular mode of operation. In addition, based on configuration information, e.g., stored in a non-volatile storage of the controller or another location within a system, controller 140 can cause transconductance stage 110 to be configured for a given mode of operation.

As will be discussed herein, a single transconductance stage can be configured in different manners to enable different modes of operation. Such different operation modes, which may have different circuit configurations, component sizes, bias currents and so forth, can depend on a given system in which the mixer is implemented. Thus in some embodiments configuration information may be fixed on incorporation of the mixer into a system and the transconductance stage can be left in a static configuration for system lifetime. In other implementations, this configuration information can be dynamically updated, e.g., via a user depending on a desired operation mode. For example, based on communication of different types of signals, different power consumption considerations and so forth, reconfiguration of at least the transconductance stage of the mixer can be performed dynamically. Although shown at this high level in the embodiment of FIG. 1, understand the scope of the present invention is not limited in this regard.

Figure 2:
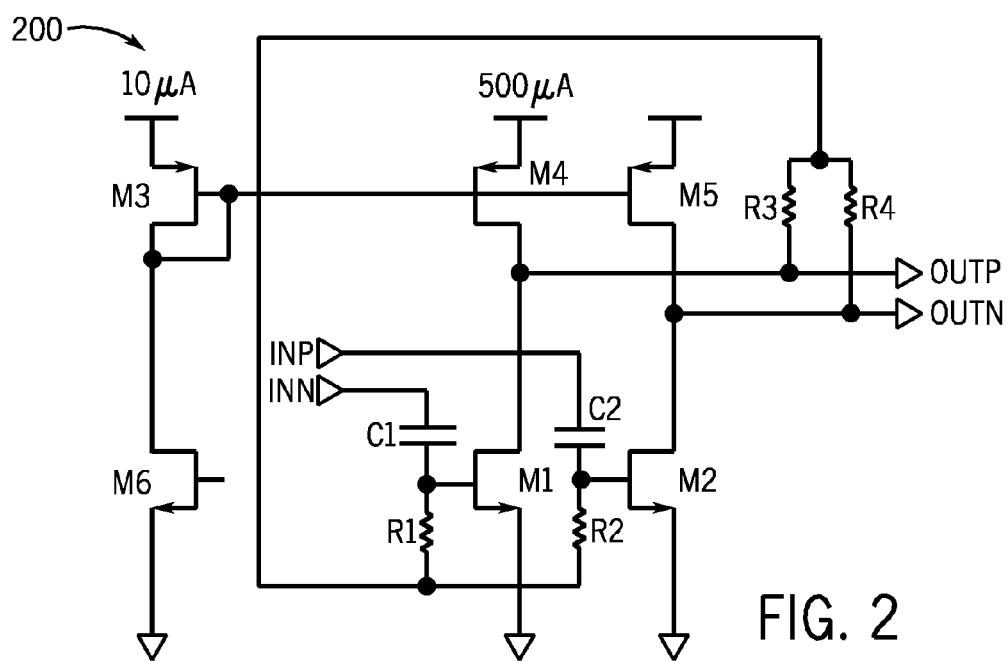
FIG. 2 is a schematic diagram of a transconductor circuit in accordance with an embodiment of the present invention.

Referring now to FIG. 2, shown is a schematic diagram of a transconductor circuit in accordance with an embodiment of the present invention. As an example, transconductor circuit 200 may correspond to transconductor stage 110 of FIG. 1. And more specifically, FIG. 2 shows this transconductance stage configured for a first mode of operation (hereafter mode 1). As seen, the input RF signals may be provided to gate terminals of a differential pair of metal oxide semiconductor field effect transistors (MOSFETs) M1 and M2 (acting as transconductors) via an RC circuit including corresponding capacitors C1 and C2 and corresponding resistors R1 and R2. Capacitors C1 and C2 may act as a DC block for the incoming signals, while resistors R1 and R2 ensure bias and operating point for the transistors by feeding a DC voltage to the gate terminal, while blocking the incoming RF signal from circuitry other than the gate terminals. In one embodiment, the resistors may be on the order of approximately 100 kΩ, while the capacitors may be on the order of approximately 0.1 pF.

Note that MOSFETs M1 and M2 have common source terminals coupled to a reference potential, e.g., a ground level, and drain terminals that provide the corresponding output currents, namely OUTp and OUTn. These drain terminals of MOSFETs M1 and M2 are further coupled to a bias circuit formed of a plurality of MOSFETs M3-M6. Namely MOSFETs M4 and M5 have common source terminals coupled to a supply voltage, and drain terminals commonly coupled with the drain terminals of MOSFETs M1 and M2. In turn, transistors M4 and M5 form a current mirror along with MOSFET M3, which is provided a reference current from MOSFET M6 to thus provide a bias current to the transconductors. In this implementation of FIG. 2, M3 is part of the current mirror, and M6 can be provided a gate voltage to provide a predetermined drain current (e.g., 10 microamperes (μA)).

As further seen in FIG. 2, a feedback circuit is included to provide a common mode voltage corresponding to a DC average voltage of the output of the differential pair, which is provided through a pair of resistors R3 and R4 to the gate terminals of MOSFETs M1 and M2. Thus M1 and M2 may essentially be configured as diode-connected transistors at DC but not at RF.

In one embodiment for this mode 1 operation, MOSFETs M1 and M2 may be relatively small devices having a relatively large turn on voltage (Von) of approximately 500 mV. For example, in a 0.11 micron complementary metal oxide semiconductor (CMOS) process, these transistors may have a typical size of approximately 4.5 microns (μm)/110 nanometers (nm). Furthermore, the bias currents provided by MOSFETs M4 and M5 may be of a relatively high level, e.g., approximately 500 microamperes (μA), while in turn the bias current provided by MOSFET M3 may be of a relatively low value, e.g., approximately 10 μA. Accordingly, this circuit provides for robustness over all process corners and temperature variation, however it does so at the cost of relatively high current consumption. In contrast, another circuit implementation may provide for similar features while reducing current consumption.

Figure 3:
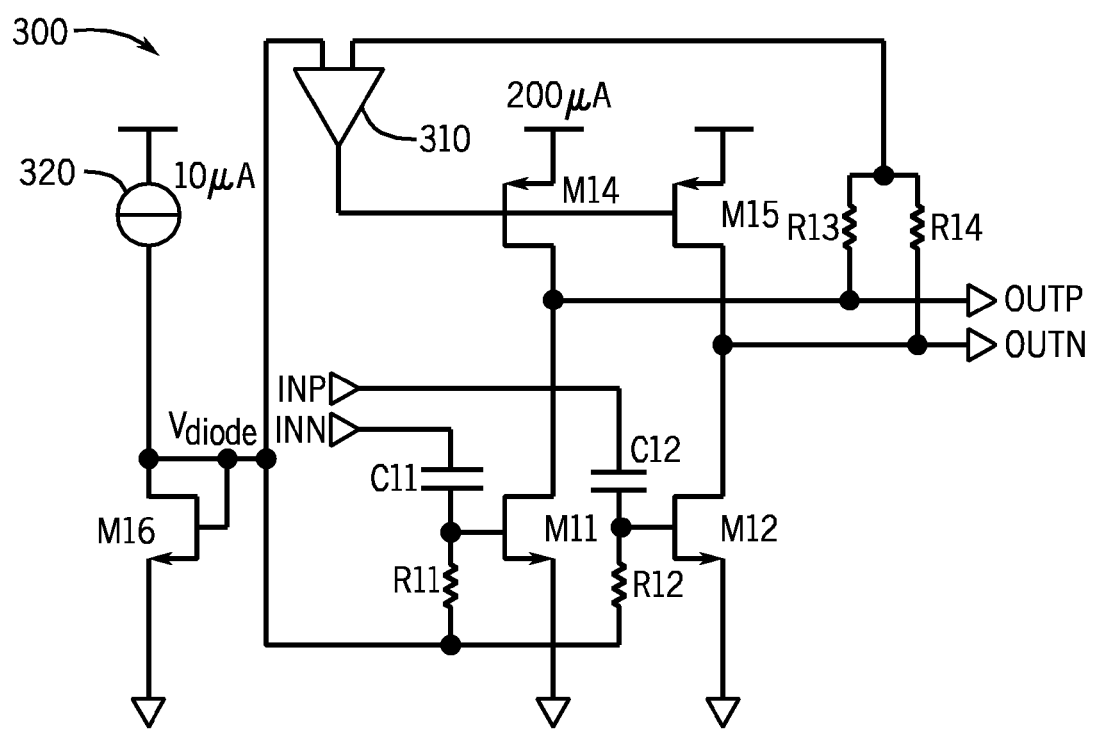
FIG. 3 is a schematic diagram of a transconductor circuit in accordance with another embodiment of the present invention.

Referring now to FIG. 3, shown is a schematic diagram of a transconductor circuit in accordance with another embodiment of the present invention. Again, transconductor circuit 300 may correspond to transconductor stage 110 of FIG. 1. However, here the circuit is configured for a second mode of operation (hereafter mode 2).

As seen in FIG. 3, the general architecture may be similar to that of FIG. 2, with transistors M11 and M12 receiving an input RF voltage and providing an output RF current. In this embodiment, however, rather than providing the common mode voltage as a feedback voltage from the output nodes to the gate terminals of MOSFETs M11 and M12 (as in FIG. 2), instead the common mode voltage is provided as one input to an operational amplifier 310, which further receives at its other input the gate voltage provided to MOSFETs M11 and M12. The output of this operational amplifier thus gates the bias circuit formed of MOSFETs M14 and M15, which can be biased with a lower bias voltage resulting from a lower drain current, e.g., approximately 200 μA. Note further that the second input to operational amplifier 310 may be a diode voltage of a diode-connected transistor M16, which has gate and drain terminals further coupled to a current source 320. This diode voltage acts as a reference voltage against which the common mode voltage is compared.

In the embodiment of FIG. 3, transistors M11 and M12 may be relatively larger than those of the FIG. 2 embodiment. For example, in the same CMOS process as above, these transistors may be roughly on the order of approximately 2×4.5 μm/110 nm. Although shown with these particular implementations in the embodiments of FIGS. 2 and 3, understand that transconductor cells that provide for a current efficient architecture may take other forms in different embodiments.

Furthermore, as discussed above understand that although shown with these different configurations in FIGS. 2 and 3, only a single transconductance circuit may be present in a particular mixer and the modes represented by FIGS. 2 and 3 can be realized by appropriate control of various switches and other components. To this end, to enable the differential transconductance pair to be of an appropriate effective size for the given mode, rather than a single MOSFET for each portion of the differential pair, in some embodiments two or more MOSFETs in parallel can be provided for each portion of the differential pair. Then based on control, e.g., by controller 140 of FIG. 1, one or more of these parallel transistors can be enabled for operation in the given mode. In this way, an appropriate effective size for the transistors of the differential pair can be realized. Similarly, note that amplifier 310 of the mode 2 configuration can be switched into the transconductance stage for this mode 2 operation, but left open and unused for the mode 1 configuration. Similarly, different bias currents can be generated and provided, e.g., by way of different current sources to provide for the appropriate bias currents, and for gating the bias circuit. Note also that in other embodiments, it is possible to provide multiple transconductor cells implemented with separate transconductor circuits 200 and 300. Then based on given control, which can be static, e.g., as set during manufacture or upon device characterization, or a dynamic control dependent upon power modes and so forth, a selected one of the multiple transconductor circuits can be enabled for operation.

Mode 1 operation, shown in FIG. 2, relies on having smaller device size and larger bias current, and therefore the transfer characteristic can be sufficiently linear to meet a given specification, regardless of process and temperature. Mode 2 operation relies on the fact that the MOS transistor characteristic has a bias point in which the second derivative of transconductance, which is responsible for the third order intermodulation, equals zero. To use this property of the MOS transistor, the common source point of the differential pair formed of M11 and M12 is grounded. Furthermore, the common mode bias in the mode 2 configuration does not use feedback from the transconductors' drain terminals to gate terminals. As compared to the mode 1 configuration, this mode configuration may have a smaller current density, thus avoiding a large Von, e.g., in the range of approximately 100 mV. As such, M11 and M12 can be larger and thus a higher transconductance can be obtained from the same or even less current. For a given current, an optimum transistor size can be selected to obtain the highest IP3, e.g., approximately 10 dBm.

For both operating modes the mixer devices can be configured of a relatively small size (e.g., approximately 4.5 to 2×4.5 um/110 nm) to ensure small capacitive load for an amplifier (e.g., LNA) coupled in front of the mixer.

Figure 4:
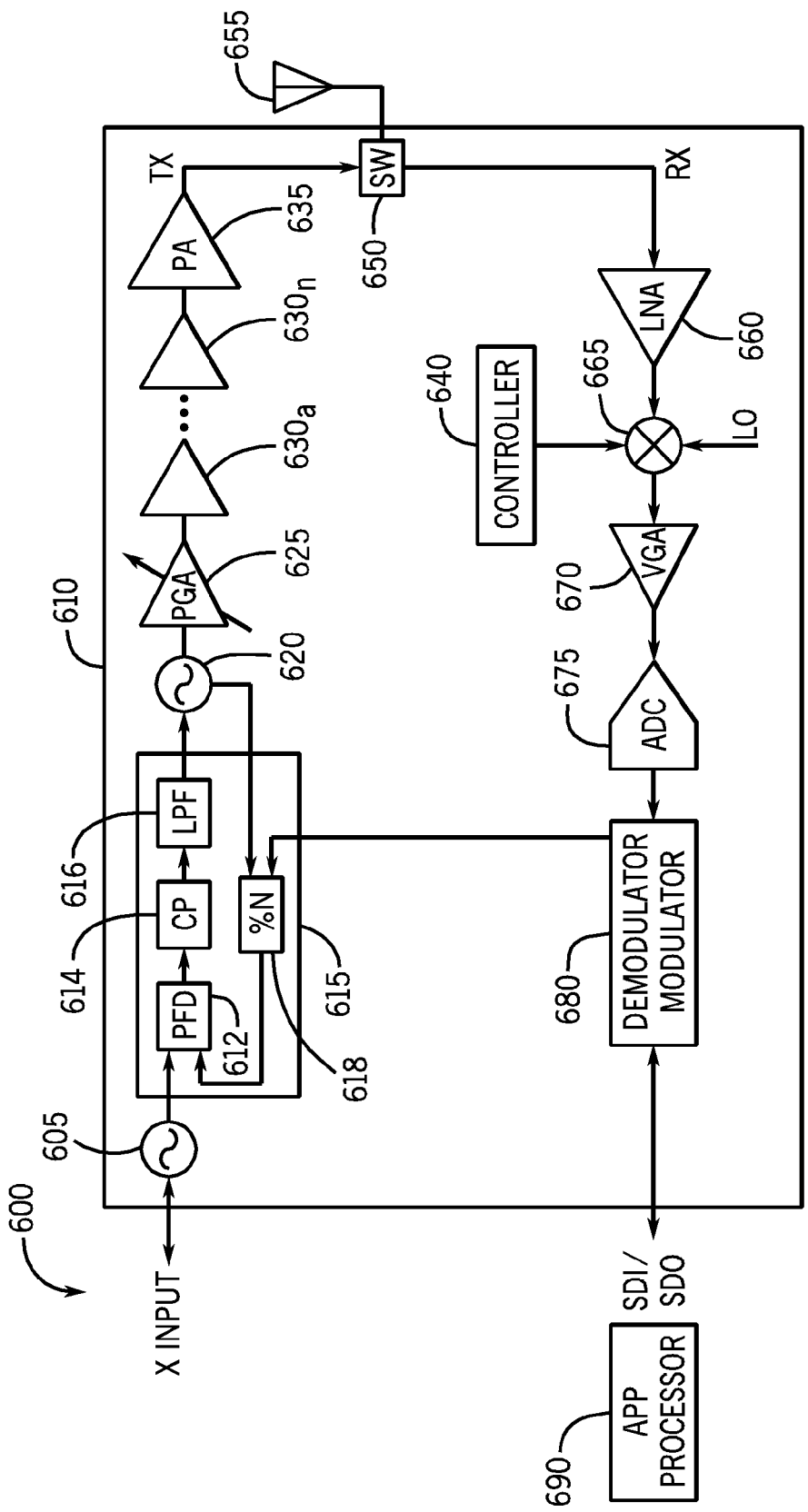
FIG. 4 is a block diagram of a system in accordance with an embodiment of the present invention.

Referring now to FIG. 4, shown is a block diagram of a system in accordance with an embodiment of the present invention. As shown in FIG. 4, system 600 may take various forms, e.g., corresponding to a consumer device including a transceiver 610 in accordance with an embodiment of the present invention. The consumer device can take many different forms, such as a given security or monitoring device, reader device, ISM device or so forth, and which includes the transceiver, e.g., to provide for short-range wireless communication. For ease of illustration, the only components of the system shown in FIG. 4 are an application processor 690, transceiver 610, and an antenna 665. Understand however that various other components may be present in a given embodiment.

In a transmit direction, data to be transmitted may be provided from application processor 690 via a serial data port, which is coupled to a modulator/demodulator 680. The modulated information can be provided to a phase lock loop (PLL) 615, which provides the modulated signal to a voltage control oscillator (VCO) 620 where it is upconverted to a RF frequency. As seen, PLL 615 may be a fractional-N PLL including a phase frequency detector 612, coupled to receive a reference frequency via an oscillator 605, a charge pump 614, a low pass filter 616, and an N divider 618.

The resulting RF signal is provided to a VGA 625 to provide a variable gain to the RF signal. As seen, multiple fixed gain stages $630_a$-$630_n$ may be coupled between VGA 625 and a PA 635, which outputs an amplified signal through an antenna switch 650 to antenna 655.

In a receive direction, incoming RF signals may be coupled through switch 650 to a receive path including a low noise amplifier (LNA) 660, which provides an amplified output to a mixer 665, which downmixes the signal according to an LO frequency which may be received, in one embodiment from VCO 620. In various embodiments, mixer 665 may include a transconductance stage, a mixer core, and a TIA, as described above. As further seen, a controller 640 such as a microcontroller unit (MCU) may be coupled to the mixer to control the transconductance stage as described above (e.g., its differential pair sizing, feedback circuit configuration and so forth). To this end, the controller may include a non-transitory storage medium to store instructions to enable configuration of a transconductance stage of a mixer as described herein. Note that this control can be set via one or more configuration registers accessible to the controller or a fixed control that is set on device manufacture. In some embodiments, the configuration register-based control can be performed dynamically, depending on a user's desire for power savings (and which may accordingly set the configuration of the transconductance stage to that of FIG. 3).

The downmixed signal, which may be at a low IF or zero IF frequency, is provided through a VGA 670 and an analog-to-digital converter (ADC) 675, which provides a digital bit stream to demodulator 680, which demodulates the information and communicates it to application processor 690. Furthermore, understand that although a transceiver is shown in the FIG. 4 embodiment, in other implementations a standalone receiver can include a mixer having a transconductance stage as described herein.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a differential transistor pair including a first transistor having a first terminal to receive a first input radio frequency (RF) voltage and to output a first RF current via a second terminal of the first transistor, and a second transistor having a first terminal to receive a second input RF voltage and to output a second RF current via a second terminal of the second transistor;
    a bias circuit coupled to the second terminals of the first and second transistors to provide a bias current to the first and second transistors; and a feedback circuit coupled to the second terminals of the first and second transistors to generate a feedback signal derived from a common mode voltage at the second terminals of the first and second transistors and to provide the feedback signal to the first terminals of the first and second transistors in a first operation mode.

2. The apparatus of claim 1, further comprising a first resistor-capacitor circuit having a capacitor coupled to a first input node configured to receive the first input RF voltage and a resistor coupled to block the first input RF voltage from other circuitry.

3. The apparatus of claim 1, further comprising a second resistor-capacitor circuit having a capacitor coupled to a second input node configured to receive the second input RF voltage and a resistor coupled to block the second input RF voltage from other circuitry.

4. The apparatus of claim 1, wherein the feedback circuit is to provide the feedback signal to the first terminals of the first and second transistors through a corresponding resistor in the first operation mode.

5. The apparatus of claim 1, wherein the feedback circuit comprises an amplifier having a first input coupled to receive the feedback signal and a second input coupled to receive a reference voltage and an output to gate the bias circuit in a second operation mode.

6. The apparatus of claim 5, wherein the bias circuit comprises a pair of transistors to provide the bias current to the first and second transistors when gated by the amplifier output.

7. The apparatus of claim 6, further comprising a diode-connected transistor having common terminals coupled to a current source and the second input of the amplifier.

8. The apparatus of claim 1, further comprising a controller to selectively control the differential transistor pair to be of a first size for the first operation mode or a second size for a second operation mode.

9. The apparatus of claim 8, wherein the controller is to further enable an amplifier having a first input coupled to receive the feedback signal and a second input coupled to receive a reference voltage and an output to gate the bias circuit in the second operation mode.

10. The apparatus of claim 8, wherein the second size is larger than the first size, and the bias current is smaller in the second operation mode than the first operation mode.

11. The apparatus of claim 1, wherein the apparatus comprises a transconductance stage for a mixer configured to receive the first and second input RF voltages and to output second frequency voltage signals.

12. The apparatus of claim 11, wherein the mixer further comprises a core stage to receive the first and second RF currents and output second frequency currents, and a transimpedance amplifier to receive the second frequency currents and to output the second frequency voltage signals.

13. A method comprising:
accessing configuration information via a controller, the configuration information to indicate a mode of operation for a transconductance stage of a mixer;
configuring a differential pair of the transconductance stage to be a first effective size for a first operation mode or a second effective size for a second operation mode according to the configuration information;
controlling a bias circuit to provide a first bias current to the differential pair for the first operation mode or a second bias current to the differential pair for the second operation mode; and
controlling a feedback circuit to provide a feedback signal to the differential pair in the first operation mode and to provide the feedback signal to a first input of an amplifier in the second operation mode.

14. The method of claim 13, further comprising accessing the configuration information from a non-volatile storage of the controller.

15. The method of claim 13, wherein configuring the differential pair to be the second effective size comprises switching at least two transistors into a first portion of the differential pair and switching at least two transistors into a second portion of the differential pair.

16. A system comprising:
a low noise amplifier (LNA) to receive and amplify a radio frequency (RF) signal; and
a mixer coupled to the LNA to receive the amplified RF signal and to downconvert the amplified RF signal to a second frequency signal, the mixer comprising:
a transconductance stage having a differential transistor pair to receive the amplified RF signal and to output an RF current, a bias circuit coupled to the differential transistor pair to provide a bias current to the differential transistor pair, and a feedback circuit coupled to the differential transistor pair to generate a feedback signal from the transconductance stage output, and to provide the feedback signal to a selected destination based on an operation mode;
a mixer core to receive the RF current and downconvert the RF current to a second frequency current using a local oscillator signal; and
a transimpedance amplifier to receive the second frequency current and to generate the second frequency signal.

17. The system of claim 16, further comprising a controller to selectively control the differential transistor pair to be of a first size for a first operation mode or a second size for a second operation mode.

18. The system of claim 17, wherein the controller is to enable an amplifier having a first input coupled to receive the feedback signal and a second input coupled to receive a reference voltage and an output to gate the bias circuit in the second operation mode.

19. The system of claim 18, wherein the feedback circuit is to provide the feedback signal to the differential transistor pair in the first operation mode, and to the first input of the amplifier in the second operation mode.

* * * * *